(12) United States Patent
Chen

(10) Patent No.: US 8,212,231 B2
(45) Date of Patent: Jul. 3, 2012

(54) RESISTIVE MEMORY DEVICE WITH AN AIR GAP

(75) Inventor: Wei-Su Chen, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 43 days.

(21) Appl. No.: 12/649,350

(22) Filed: Dec. 30, 2009

(65) Prior Publication Data

US 2011/0155991 A1    Jun. 30, 2011

(30) Foreign Application Priority Data

Dec. 29, 2009   (TW) ............................... 98145665 A

(51) Int. Cl.
*H01L 47/00* (2006.01)
(52) U.S. Cl. ............. 257/4; 257/E27.104; 257/E21.666; 257/E21.667
(58) Field of Classification Search ....... 257/3, E21.666, 257/E21.667
See application file for complete search history.

(56) References Cited

U.S. PATENT DOCUMENTS

| | | | |
|---|---|---|---|
| 6,795,338 B2 | 9/2004 | Parkinson et al. | |
| 6,815,704 B1 | 11/2004 | Chen | |
| 6,936,840 B2 | 8/2005 | Sun et al. | |
| 7,113,055 B2 | 9/2006 | Nakatsuka et al. | |
| 7,259,038 B2 | 8/2007 | Scheuerlein | |
| 7,393,776 B2 | 7/2008 | Colburn et al. | |
| 2004/0165422 A1* | 8/2004 | Hideki et al. | 365/163 |
| 2006/0249726 A1 | 11/2006 | Choi et al. | |
| 2007/0115794 A1 | 5/2007 | Lung | |
| 2007/0126040 A1 | 6/2007 | Lung | |
| 2007/0132049 A1 | 6/2007 | Stipe | |
| 2007/0158200 A1 | 7/2007 | Cohen et al. | |
| 2007/0158633 A1* | 7/2007 | Lai et al. | 257/4 |
| 2007/0160760 A1 | 7/2007 | Shin et al. | |
| 2007/0236988 A1 | 10/2007 | Chen | |
| 2007/0246699 A1 | 10/2007 | Lung | |
| 2007/0272950 A1 | 11/2007 | Kim et al. | |
| 2008/0029481 A1 | 2/2008 | Kothari et al. | |
| 2008/0073637 A1 | 3/2008 | Kuh et al. | |
| 2008/0096344 A1 | 4/2008 | Lai et al. | |
| 2008/0304308 A1 | 12/2008 | Stipe | |
| 2009/0148981 A1 | 6/2009 | Lai et al. | |

* cited by examiner

*Primary Examiner* — Daniel Whalen
(74) *Attorney, Agent, or Firm* — Jianq Chyun IP Office

(57) ABSTRACT

A resistive memory device and a fabricating method thereof are introduced herein. In resistive memory device, a plurality of bottom electrodes is disposed in active region of a substrate. Each of the bottom electrodes is disposed to correspond to each of the conductive channels; a patterned resistance switching material layer and the patterned top electrode layer are sequentially stacked on the bottom electrodes. An air dielectric layer exists between the patterned resistance switching material layer and the bottom electrodes. A plurality of patterned interconnections is disposed on the patterned top electrode.

7 Claims, 13 Drawing Sheets

RESISTIVE MEMORY DEVICE WITH AN AIR GAP

CROSS-REFERENCE TO RELATED APPLICATION

This application claims the priority benefit of Taiwan application serial no. 98145665, filed Dec. 29, 2009. The entirety of the above-mentioned patent application is hereby incorporated by reference herein and made a part of specification.

BACKGROUND OF THE INVENTION

1. Field of the Invention

The invention is related to a resistive memory device with an air dielectric layer, and a method to fabricate the same.

2. Description of Related Art

As portable products rapidly develop and demands for functions increase, demands in the global memory market are rapidly expanding. In particular, the growth of non-volatile memories (NVM) has drawn the most attention. In order to deal with market changes, big factories and research facilities around the globe have begun development in next generation memory technologies. Among the many types of possible technologies, resistive random access memory (RRAM) is one of highly focused technologies.

In a resistive memory device, current heating effects are used to change a resistance value of a resistance switching material layer, and different resistance values represent different bit values. For example, a high resistance value represents 1, and a low resistance value represents 0.

In the resistive memory device, a metal oxide is generally used as the resistance switching material layer. Contact holes often exist near the resistance switching material layer. The contact holes are formed by a material such as silicon oxide or silicon nitride. However, during the process of fabricating the resistive memory device, the dielectric layer generates leakage currents due to the process, and the leakage currents damage the electrical characteristics of the resistance switching material layer. In addition, during the process of fabricating the resistive memory device, charges carried by a plasma which is used for etching or cleaning may also damage the electrical characteristics of the resistance switching material layer. As a result, an amount of change and a degree of uniformity in the resistance values when the resistive memory device is turned on or turned off are adversely affected.

SUMMARY OF THE INVENTION

A resistive memory device with an air dielectric layer is introduced herein, which is capable of operating at a high radio frequency, eliminating stray capacitance, and forming a resistive memory device with a high density.

In one of exemplary embodiments, a resistive memory device fabricating method is described. First, a substrate which has an active region is provided. A front end circuit (FEOL CKT) is formed in the active region, and the front end circuit has a plurality of conductive channels arranged as an array. A plurality of bottom electrodes is formed in the active region, and each of the bottom electrodes is disposed to correspond to each conductive channel. The patterned sacrificial layer is formed on the substrate and covers the bottom electrodes. The patterned sacrificial layer has a plurality of openings. Each of the openings is disposed to correspond to each of the bottom electrodes and exposes a part of each of the bottom electrodes. A resistance switching material layer and a top electrode layer are sequentially formed on the patterned sacrificial layer, wherein the resistance switching material layer and the top electrode layer fill the openings. The top electrode, the resistance switching material layer, and the patterned sacrificial layer outside the active region are removed. Afterwards, a conductive layer is formed on the substrate. Subsequently, the conductive layer, the top electrode, and the resistance switching material layer are subsequently patterned, so that a plurality of patterned interconnections is formed by the conductive layer, and a part of the patterned sacrificial layer is exposed. Then, the reactant is provided to react with the patterned sacrificial layer, and the patterned sacrificial layer is removed to form the air dielectric layer disposed at the original position of the patterned sacrificial layer.

In one of exemplary embodiments, a resistive memory device is described herein. The resistive memory device includes a substrate, the plurality of bottom electrodes. The resistive memory device further includes a patterned resistance switching material layer, a patterned top electrode layer, and the plurality of patterned interconnections, which are sequentially stacked. The substrate has the active region, and a front end circuit is formed in the active region. The front end circuit has the plurality of conductive channels arranged as an array. The bottom electrodes are formed in the active region, and each of the bottom electrodes is disposed to correspond to each of the conductive channels. The patterned resistance switching material layer and the patterned top electrode layer are sequentially stacked on the bottom electrodes. In particular, the air dielectric layer exists between the patterned resistance switching material layer and the bottom electrodes. The patterned interconnections are disposed on the patterned top electrode.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
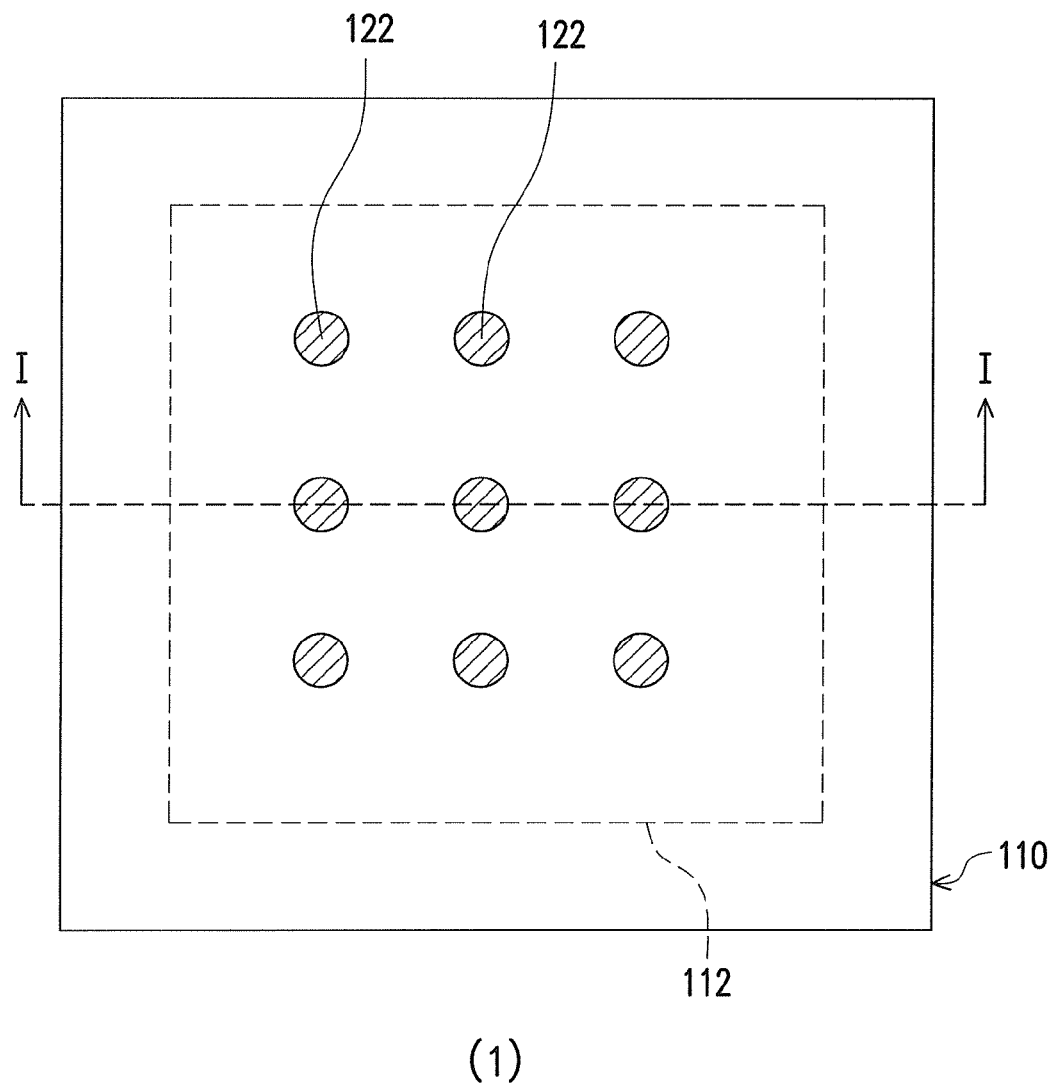
FIGS. 1A to 1J are schematic views showing a process of a resistive memory device fabricating method according to an embodiment of the invention.

In one of exemplary embodiments, a resistive memory device fabricating method is provided and may be, but is not limited to being completed by the following steps. A substrate which has an active region is provided. A front end circuit (FEOL CKT) is formed in the active region, and the front end circuit has a plurality of conductive channels arranged as an array. A plurality of bottom electrodes is formed in the action region, and each of the bottom electrodes is disposed to correspond to each of the conductive channels. The patterned sacrificial layer is formed on the substrate and covers the bottom electrodes. The patterned sacrificial layer has a plurality of openings, in which each of the openings is disposed to correspond to each of the bottom electrodes and exposes a part of each of the bottom electrodes.

A resistance switching material layer and a top electrode layer are sequentially formed on the patterned sacrificial layer, wherein the resistance switching material layer and the top electrode layer fill the openings. The top electrode, the resistance switching material layer, and the patterned sacrificial layer outside the active region are removed. Then, a conductive layer is formed on the substrate. The conductive layer, the top electrode, and the resistance switching material layer are subsequently patterned, so that a plurality of patterned interconnections is formed by the conductive layer, and a part of the patterned sacrificial layer is exposed. Afterwards, the reactant is provided to react with the patterned sacrificial layer, and the patterned sacrificial layer is removed to form an air dielectric layer disposed at the original position of the patterned sacrificial layer.

In one of exemplary embodiments, the material of the patterned sacrificial layer may include the germanium-antimony-tellurium alloy.

In one of exemplary embodiments, the reactant includes the organic acid which substantially includes, for example, gallic acid and the solvent.

In one of exemplary embodiments, the reactant includes the hydrogen-helium plasma. The weight percentage of hydrogen in the hydrogen-helium plasma is 5%, and the weight percentage of helium in the hydrogen-helium plasma is 95%. The hydrogen-helium plasma reacts with the patterned sacrificial layer for about 400 to 800 seconds. The weight percentage of hydrogen and the reaction time may be adjusted according to design requirements and are not limited to the above conditions.

In one of exemplary embodiments, after the step of removing the patterned sacrificial layer, the step of washing the resistance switching material layer with deionized water is further included. According to the present embodiment, after the step of washing the resistance switching material layer with deionized water, isopropyl alcohol (IPA) is further used to dry clean the resistance switching material layer, so that the water which causes pattern collapse is completely brought away by the IPA.

In one of exemplary embodiments, the annealing temperature of the patterned sacrificial layer is from about 100° C. (degrees centigrade) to 400° C.

In one of exemplary embodiments, the material of the patterned sacrificial layer includes an amorphous carbon thin film. The reactant includes the oxygen plasma.

In one of exemplary embodiments, each of the bottom electrodes includes a first film layer and a second film layer on the first film layer, and a material of the first film layer and the second film layer includes, for example, a titanium (Ti)- and titanium nitride (TiN). It should be noted that the metal stack of the first film layer and the second film layer may be changed with the constant improvement in the electrical characteristic of the resistive memory device; the number of the layers may be increased or decreased. In other words, the structure and material of the metal stack may be adequately adjusted. According to an embodiment of the invention, the top electrode includes a third film layer and a fourth film layer on the third film layer, and a material of the third film layer and the fourth film layer is, for example, a titanium (Ti) and titanium nitride (TiN). Similarly, the metal stack of the third film layer and the fourth film layer may be changed with the constant improvement in the electrical characteristic of the resistive memory device; the number of the layers may be increased or decreased. In other words, the structure and material of the metal stack may be adequately adjusted.

In one of exemplary embodiments, a material of the conductive layer includes aluminum (Al), an aluminum-copper (Al—Cu) alloy, an aluminum-tantalum nitride (Al—TaN) bi-layer, an aluminum-copper-tantalum nitride (AlCu—TaN) bi-layer, or an aluminum-copper-titanium nitride (AlCu—TiN) bi-layer.

In one of exemplary embodiments, the material of the resistance switching material layer includes: hafnium oxide ($HfO_x$), nickel oxide ($NiO_x$) titanium oxide ($TiO_x$), zirconium oxide ($ZrO_x$), silicon oxide ($SiO_x$, wherein x is not equal to 2), tungsten oxide ($WO_x$), or copper oxide ($CuO_x$).

An embodiment provides a resistive memory device, which includes the substrate, the plurality of bottom electrodes, and the following which are sequentially stacked: the patterned resistance switching material layer, the patterned top electrode layer, and the plurality of patterned interconnections. The substrate has the active region, and the front end circuit is fowled in the active region. The front end circuit has the plurality of conductive channels arranged as an array. The bottom electrodes are formed in the active region, and each of the bottom electrodes is disposed to correspond to each of the conductive channels. The patterned resistance switching material layer and the patterned top electrode layer are sequentially stacked on the bottom electrodes. In particular, an air dielectric layer exists between the patterned resistance switching material layer and the bottom electrodes. The patterned interconnections are disposed on the patterned top electrode.

In one of exemplary embodiments, each of the bottom electrodes includes the first film layer and the second film layer on the first film layer, and the material of the first film layer and the second film layer is, for example, a titanium (Ti)- and titanium nitride TiN).

In one of exemplary embodiments, the material of the patterned resistance switching material layer includes hafnium oxide ($HfO_x$), nickel oxide ($NiO_x$) titanium oxide ($TiO_x$), zirconium oxide ($ZrO_x$), silicon oxide ($SiO_x$, wherein x is not equal to 2), tungsten oxide ($WO_x$), or copper oxide ($CuO_x$), alone or combination thereof.

In one of exemplary embodiments, the patterned top electrode includes the third film layer and the fourth film layer on the third film layer. According to an embodiment, each of the materials of the third film layer and the fourth film layer may be the stacked structure of titanium (Ti) and titanium nitride (TiN).

In one of exemplary embodiments, the material of the patterned interconnections may be, for example, an aluminum-metal single or multi-layer, such as pure aluminum (Al), an aluminum-copper (Al—Cu) alloy, an aluminum-tantalum nitride (Al—TaN) bi-layer, an aluminum-copper-tantalum nitride (AlCu—TaN) bi-layer, an aluminum-copper-titanium nitride (AlCu—TiN) bi-layer, or a material which may include any metals.

In the following, some of exemplary embodiments are described in associate with the figures, but not limited thereto.

Resistive Memory Device Fabricating Method

FIGS. 1A to 1J are schematic views showing a process of a resistive memory device fabricating method according to an embodiment of the invention. In each of FIGS. 1A to 1J, the line I-I is drawn along the X direction, and the line II-II is drawn along the Y direction. Please refer to FIGS. 1A to 1J to comprehend the fabricating process of the resistive memory device.

Referring to FIG. 1A, part (1) is a top view of the device, and part (2) is a cross-sectional view along the line I-I in part (1). First, a substrate 110 which has an active region 112 is provided. A front end circuit 120 is formed in the active region 112, and the front end circuit 120 has a plurality of conductive channels 122 arranged as an array.

Figure 1B:
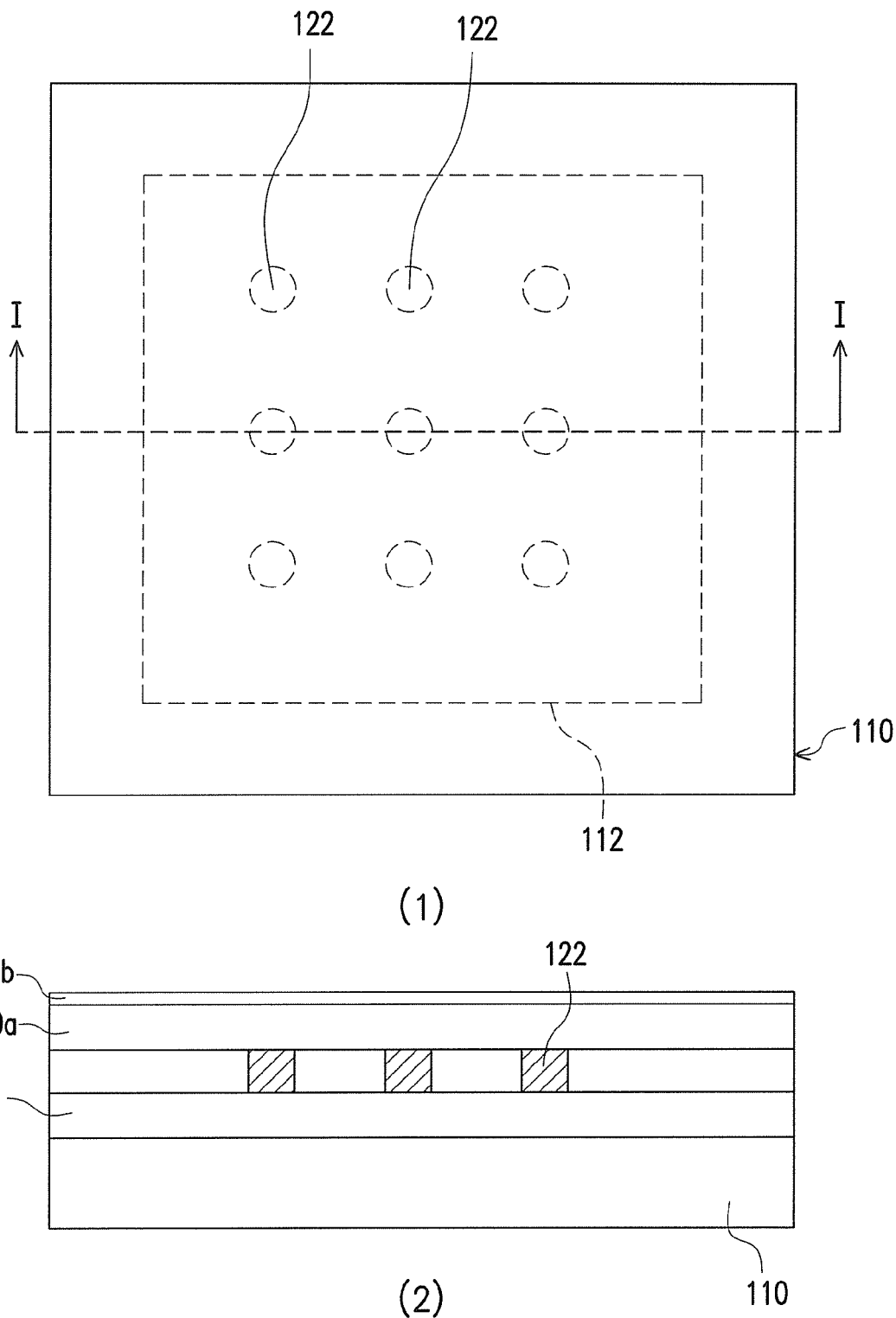
Figure 1C:
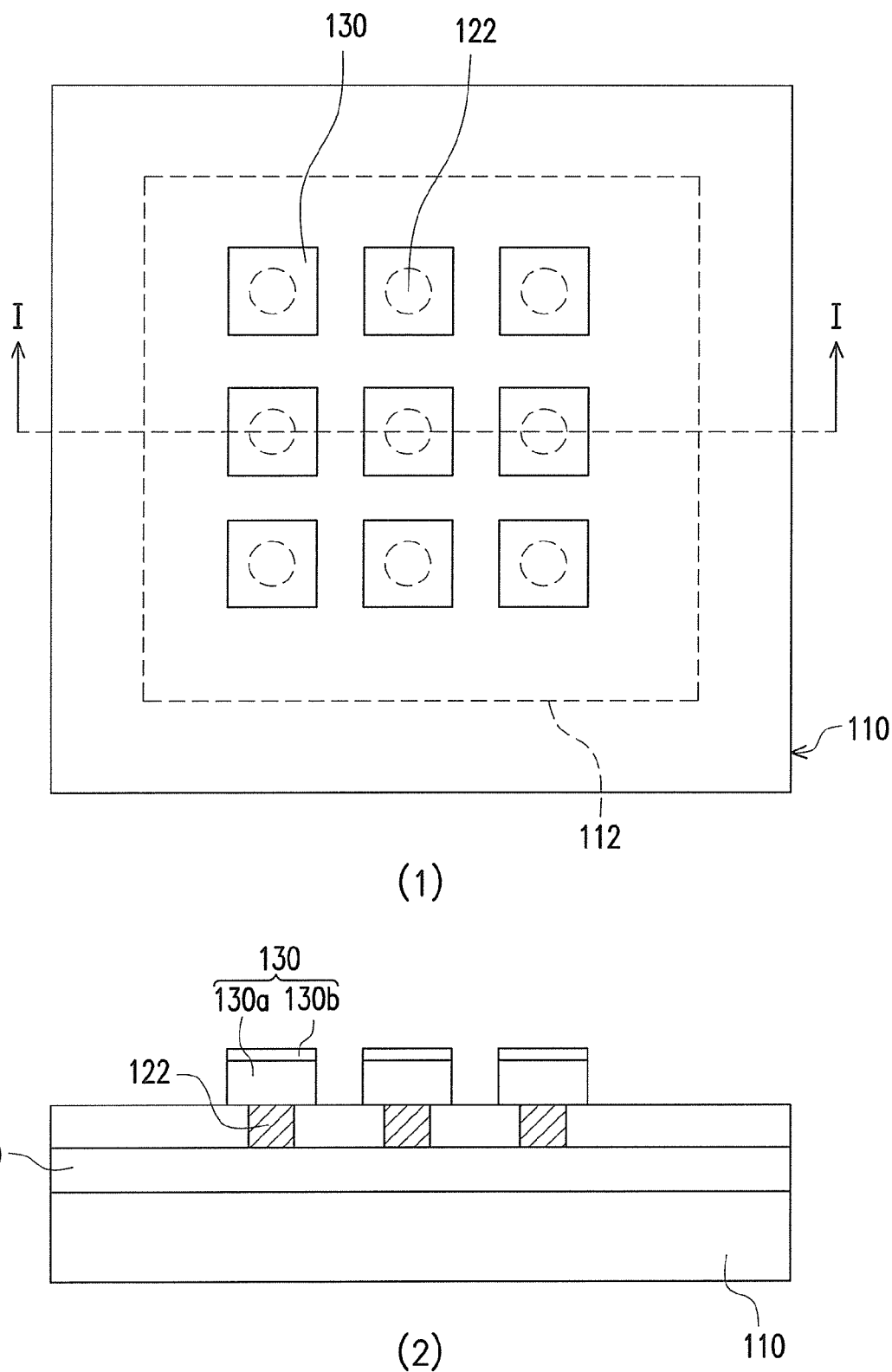

Referring to each of FIGS. 1B and 1C, part (1) is a top view of the device, and part (2) is a cross-sectional view along the line I-I in part (1). Next, a plurality of bottom electrodes 130 is formed in the active region 112, and each of the bottom electrodes 130 is disposed to correspond to each of the conductive channels 122. The step for forming the bottom electrode 130 is, for example, sequentially depositing a first film layer 130a and a second film layer 130b on the substrate 110 shown in FIG. 1B. Then, as shown in FIG. 1C, a photolithography and etching process is performed on the first film layer 130a and the second film layer 130b. Hence, the plurality of bottom electrodes 130 is formed. Referring to FIG. 1C, each of the bottom electrodes 130 includes the first film layer 130a and the second film layer 130b on the first film layer 130a, and a material of the first film layer 130a may be titanium (Ti), and a material of the second film layer may be titanium nitride (TiN). However, the metal stack of the first film layer 130a and the second film layer 130b may be changed with the constant improvement in the electrical characteristic of the resistive memory device; the number of the layers may be increased or decreased. In other words, the structure and material of the metal stack may be adequately adjusted. The above is one of the examples, and the present invention is not limited thereto.

Figure 1D:
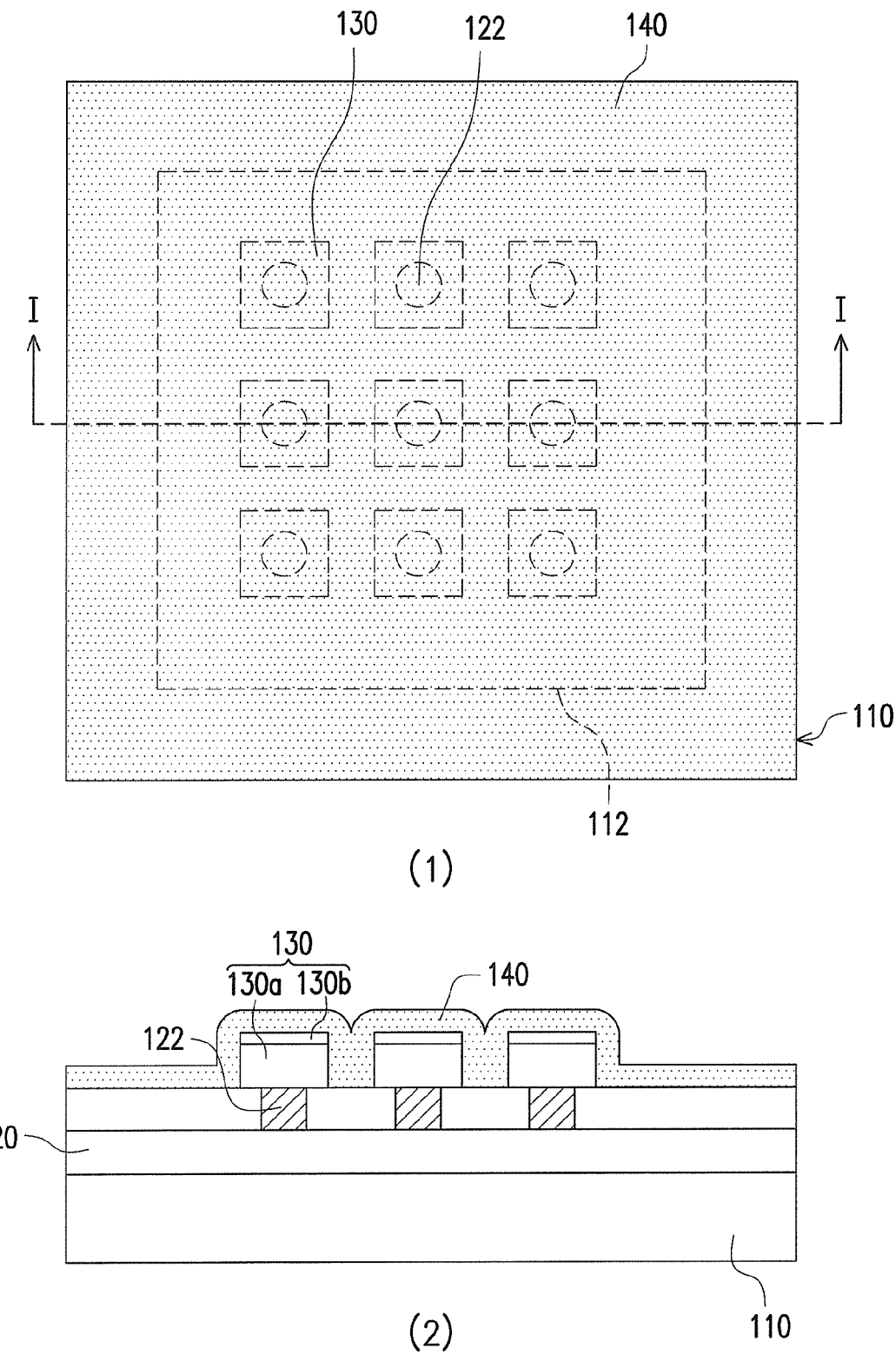
Figure 1E:
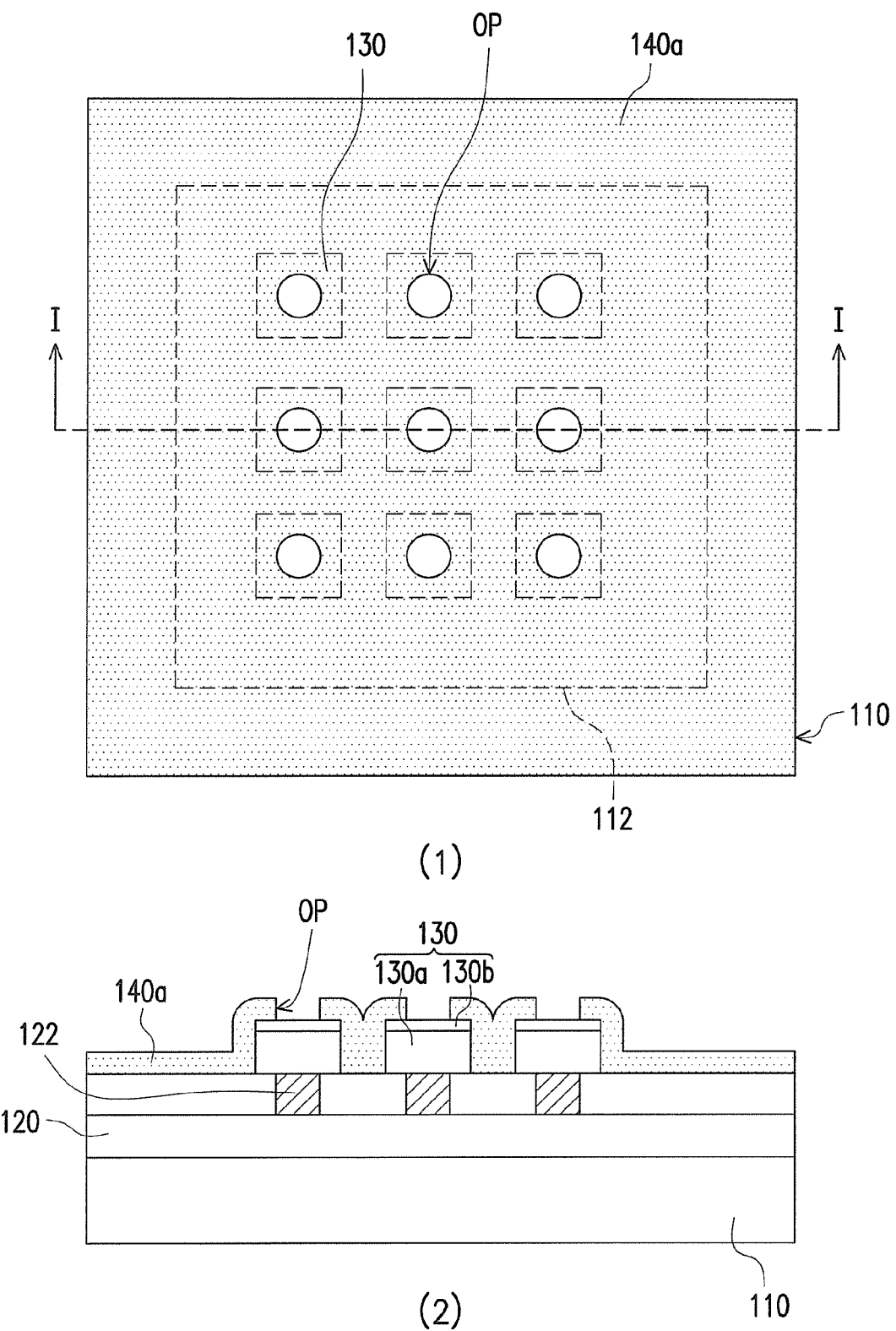

Referring to each of FIGS. 1D and 1E, part (1) is a top view of the device, and part (2) is a cross-sectional view along the line I-I in part (1). Next, a patterned sacrificial layer 140a is formed on the substrate 110 and covers the bottom electrodes 130. The patterned sacrificial layer 140a has a plurality of openings OP. Each of the openings OP is disposed to correspond to each of the bottom electrodes 130 and exposes a part of each of the bottom electrodes 130. The steps for forming the patterned sacrificial layer 140a are, for example, described as follows. A sacrificial layer 140 is formed on the substrate 110 shown in FIG. 1D. Then, as shown in FIG. 1E, a photolithography and etching process is performed on the sacrificial layer 140a to form the openings OP. According to an embodiment, a material of the patterned sacrificial layer 140a includes the germanium-antimony-tellurium alloy or the amorphous carbon thin film. An annealing temperature of the patterned sacrificial layer 140a is from 100° C. to 400° C.

Figure 1F:
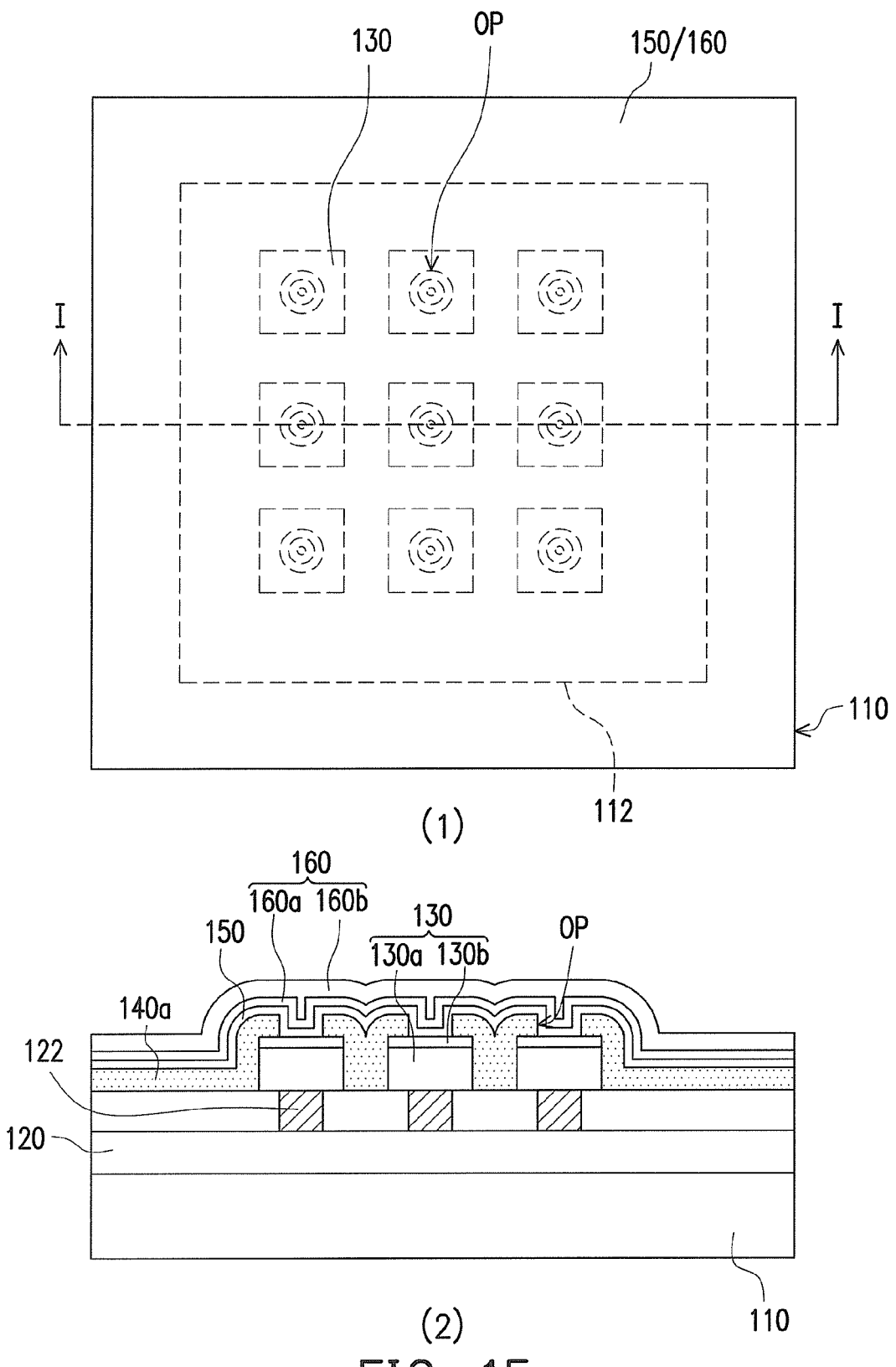

Referring to FIG. 1F, part (1) is a top view of the device, and part (2) is a cross-sectional view along the line I-I in part (1). Then, a resistance switching material layer 150 and a top electrode layer 160 are sequentially formed on the patterned sacrificial layer 140a, wherein the resistance switching material layer 150 and the top electrode layer 160 fill the openings OP. The resistance switching material layer 150 may include hafnium oxide ($HfO_x$), nickel oxide ($NiO_x$) titanium oxide ($TiO_x$), zirconium oxide ($ZrO_x$), silicon oxide ($SiO_x$, where x is not equal to 2), tungsten oxide ($WO_x$), or copper oxide ($CuO_x$), alone or combination thereof. Each of the top electrodes 160 may include a third film layer 160a and a fourth film layer 160b on the third film layer 160a, and a material of the third film layer 160a may be, for example, titanium (Ti), and a material of the fourth film layer may be, for example, titanium nitride (TiN). However, the metal stack of the third film layer 160a and the fourth film layer 160b may be changed with the constant improvement in the electrical characteristic of the resistive memory device; the number of the layers may be increased or decreased. In other words, the structure and material of the metal stack may be adequately adjusted. The above is merely one of the examples, and the present invention is not limited thereto.

Figure 1G:
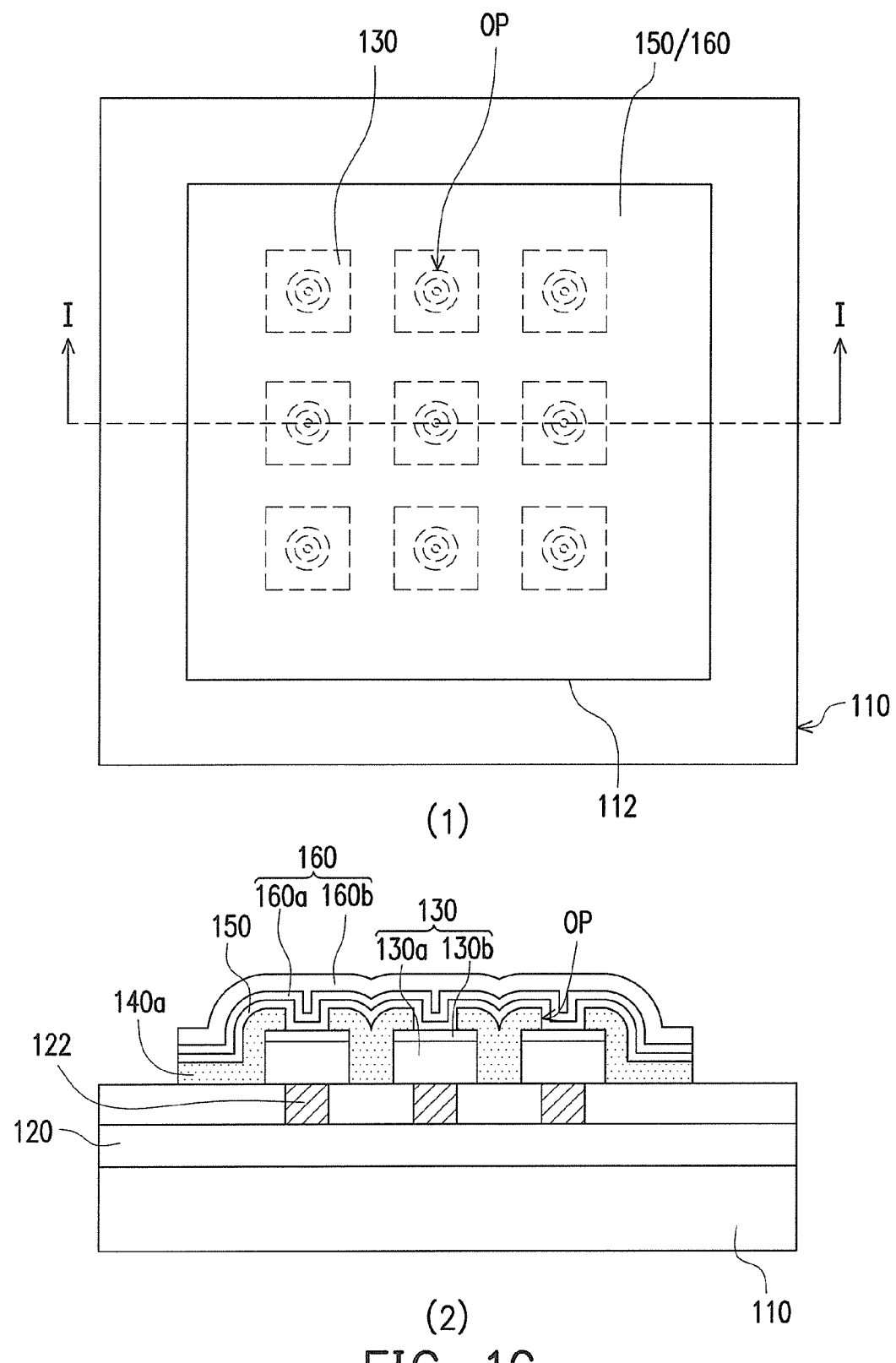

Referring to FIG. 1G, part (1) is a top view of the device, and part (2) is a cross-sectional view along the line I-I in part (1). Next, the top electrode layer 160, the resistance switching material layer 150, and the patterned sacrificial layer 140a outside the active region 112 are removed. The above step may be performed by a general photolithography and etching process.

Figure 1H:
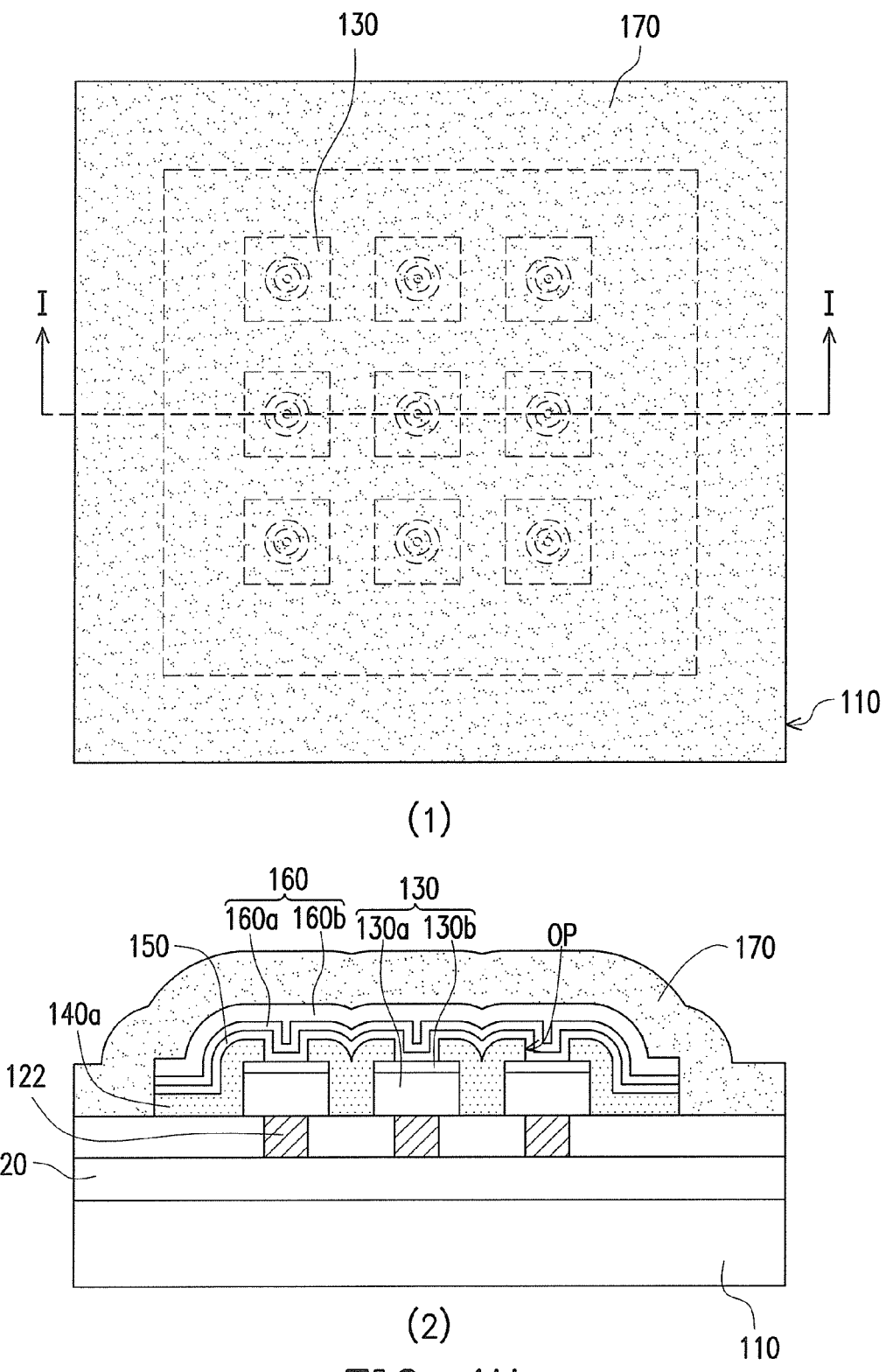

Referring to FIG. 1H, part (1) is a top view of the device, and part (2) is a cross-sectional view along the line I-I in part (1). Then, a conductive layer 170 is farmed on the substrate 110. The method of forming the conductive layer 170 may be a physical vapor deposition method or an appropriate thin film deposition process. A material of the conductive layer 170 may be, for example, an aluminum-metal single or multi-layer, such as pure aluminum (Al), an aluminum-copper (Al—Cu) alloy, an aluminum-tantalum nitride (Al—TaN) bi-layer, an aluminum-copper-tantalum nitride (AlCu—TaN) bi-layer, an aluminum-copper-titanium nitride (AlCu—TiN) bi-layer, or a material which may include any metals.

Figure 1I:
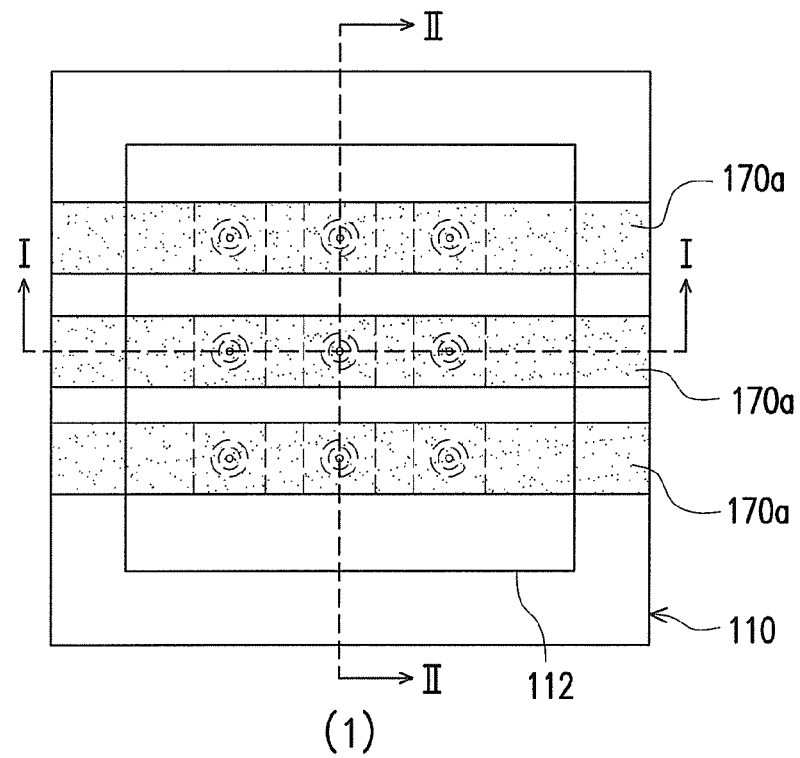
Figure 1I:
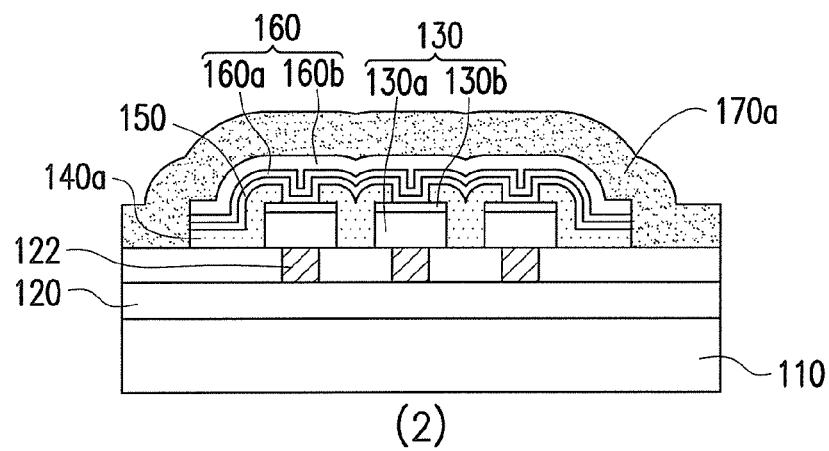
Figure 1I:
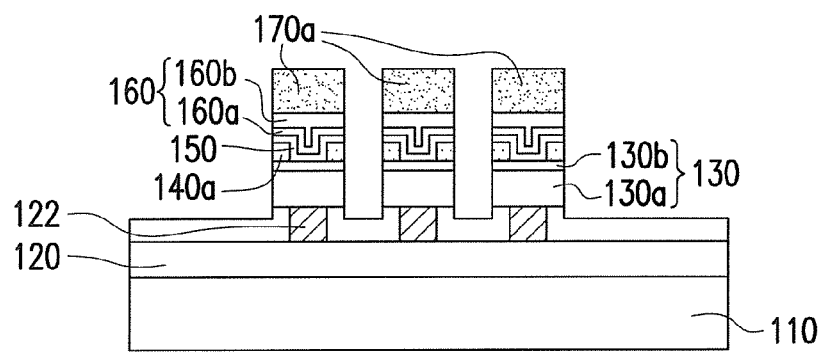

Referring to FIG. 1I, part (1) is a top view of the device, part (2) is a cross-sectional view along the line I-I in part (1), and part (3) is a cross-sectional view along the line II-II in part (1). Next, the conductive layer 170, the top electrode layer 160, and the resistance switching material layer 150 are subsequently patterned, so that a plurality of patterned interconnections 170a is formed by the conductive layer 170, and a part of the patterned sacrificial layer 140a is exposed. In detail, as shown in part (3) of FIG. 1I, during the photolithography and etching process on the conductive layer 170, the multi-layered film stack (the top electrode 160 and the resistance switching material layer 150) are over etched, so that sides of the patterned sacrificial layer 140a are exposed. 100% etched out of patterned sacrificial layer 140a within space between two conductive lines 170 is optional for the sake of avoiding plasma charging.

Figure 1J:
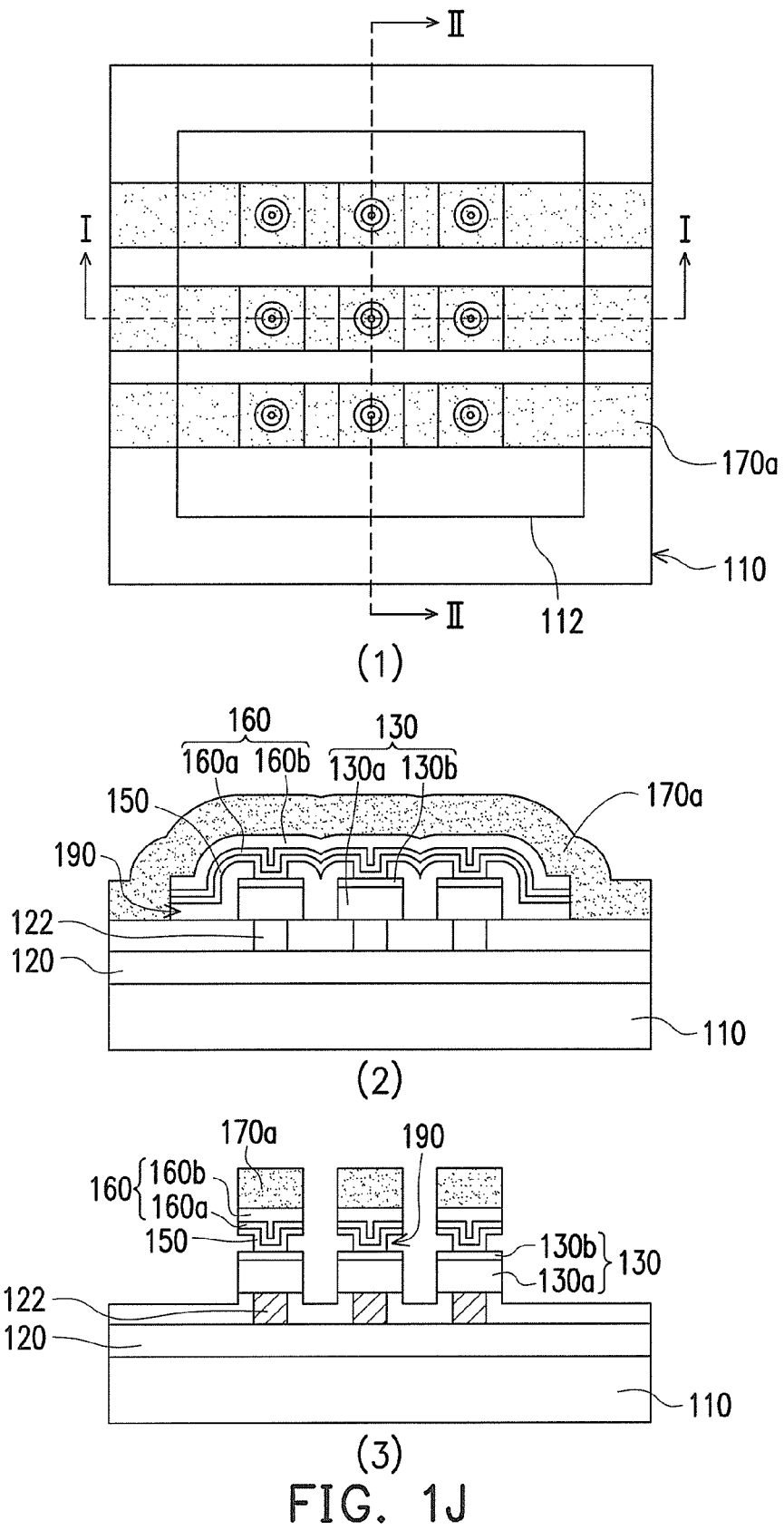

Referring to FIG. 1J, part (1) is a top view of the device, part (2) is a cross-sectional view along the line I-I in part (1), and part (3) is a cross-sectional view along the line II-II in part (1). Afterwards, a reactant is provided to react with the patterned sacrificial layer 140a, and the patterned sacrificial layer 140a is removed to form an air dielectric layer 190 disposed at the original position of the patterned sacrificial layer 140a. For example, when the material of the patterned sacrificial layer 140a is the germanium-antimony-tellurium alloy, the reactant is, for example, the organic acid which substantially includes gallic acid and the solvent. Alternatively, the reactant may be the hydrogen-helium plasma. The weight percentage of hydrogen in the hydrogen-helium plasma is, for example, substantially about 5%, and the weight percentage of helium in the hydrogen-helium plasma is, for example, about 95%. The hydrogen-helium plasma reacts with the sacrificial layer 140a for 400 to 800 seconds. Additionally, when the material of the patterned sacrificial layer 140a is the amorphous carbon thin film, the reactant may be the oxygen plasma. By performing the above steps, the resistive memory device is fabricated.

Still referring to FIG. 1J, after the step of removing the patterned sacrificial layer 140a, the resistance switching material layer 150 may be further washed with the deionized water. In addition, after the step of washing the resistance switching material layer 150 with the deionized water, IPA is further used to perform dry cleaning on the resistance switching material layer 150, so that the water which causes pattern collapse is substantially completely brought away by the IPA.

Next, please refer to FIG. 1I. Since the patterned sacrificial layer 140a adopts the germanium-antimony-tellurium alloy or the amorphous carbon thin film which is conductive, the patterned sacrificial layer 140a has effects of connecting electrodes in parallel. In detail, when the plasma (not shown) is used to etch the conductive layer 170, the top electrode 160, and the resistance switching material layer 150, most of the charges in the plasma are conducted onto the patterned sacrificial layer 140a but not to an interface between the resistance switching material layer 150 and the bottom electrodes 130. Hence, damage to the electrical characteristics of the interface (the operating region of the resistive memory device) between the resistance switching material layer 150 and the bottom electrodes 130 is avoided, so that the resistive memory device maintains good operating characteristics.

Afterwards, the reactant is highly selective towards the patterned sacrificial layer 140, so that the patterned sacrificial layer 140a is well removed, thereby forming the air dielectric layer 190 in the resistive memory device. In particular, the reactant does not include halogens, so that the reactant does not affect the film layers and the electrical characteristics of the resistive memory device. When the reactant is the organic acid (which includes gallic acid and the solvent) and is used for wet washing, the damage to the resistive memory device caused by the charges in the plasma is further prevented.

The annealing temperature of the patterned sacrificial layer 140a may be from 100° C. to 400° C., so that the patterned sacrificial layer 140a is only removed at the last step of the process. In other words, the patterned sacrificial layer 140a is capable of sustaining the high temperature during formation of the conductive layer 170 in FIG. 1H and is not damaged by the high temperature environment.

The air dielectric layer 190 of the resistive memory device is able to prevent leakage current effects to eliminate noise, and is able to reduce parasitic capacitance so that the resistive memory device is capable of operating at high frequencies.

As shown in FIG. 1J, the resistive memory device which has the conductive channels 122 may have a same memory density as a pillar resistive memory device. Thus, the density of resistive memory units is greatly increased.

Resistive Memory Device

FIG. 1J is a schematic view of a resistive memory device according to an embodiment of the invention, wherein part (1) is a top view of the device, part (2) is a cross-sectional view along the line I-I in part (1), and part (3) is a cross-sectional view along the line II-II in part (1). The resistive memory device includes the substrate 110, the plurality of bottom electrodes 130, and the following which are sequentially stacked: the patterned resistance switching material layer 150, the patterned top electrode layer 160, and the plurality of patterned interconnections 170a. The substrate 110 has the active region 112, and the front end circuit 120 is formed in the active region 112. The front end circuit 120 has the plurality of conductive channels 122 arranged as an array. The bottom electrodes 130 are formed in the active region 112, and each of the bottom electrodes 130 is disposed to correspond to each of the conductive channels 122. The patterned resistance switching material layer 150 and the patterned top electrode layer 160 are sequentially stacked on the bottom electrodes 130. In particular, the air dielectric layer 190 exists between the patterned resistance switching material layer 150 and the bottom electrodes 130. The patterned interconnections 170a are disposed on the patterned top electrode 160.

The composition, material, and the like of each element of the resistive memory device are described in the resistive memory fabrication method shown in FIGS. 1A to 1J and are not repeatedly described.

Air Gap Fabricating Method

Figure 2A:
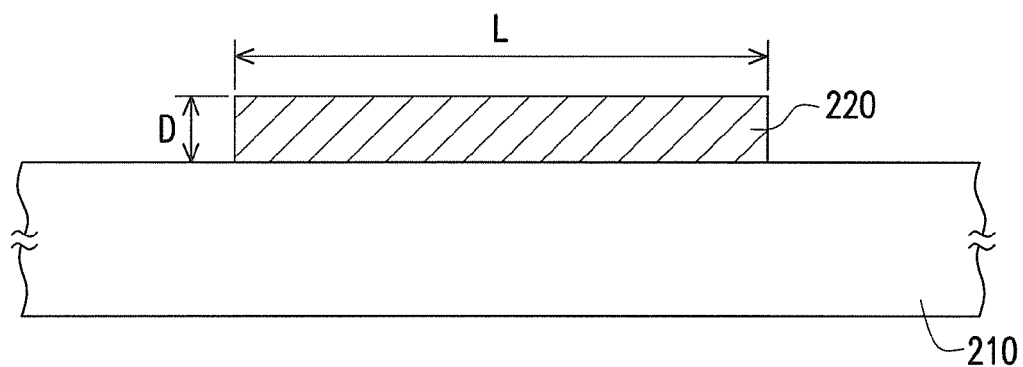
FIGS. 2A to 2E are schematic views showing a process of an air gap fabricating method according to an embodiment of the invention.
Figure 2B:
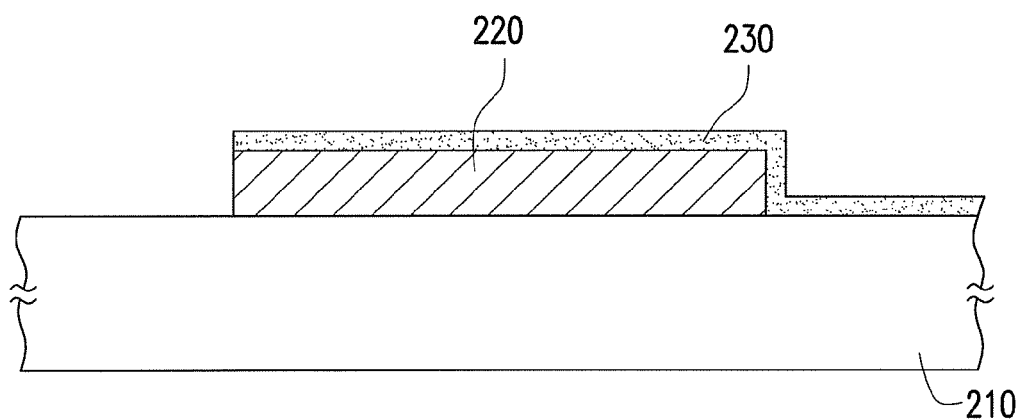
Figure 2C:
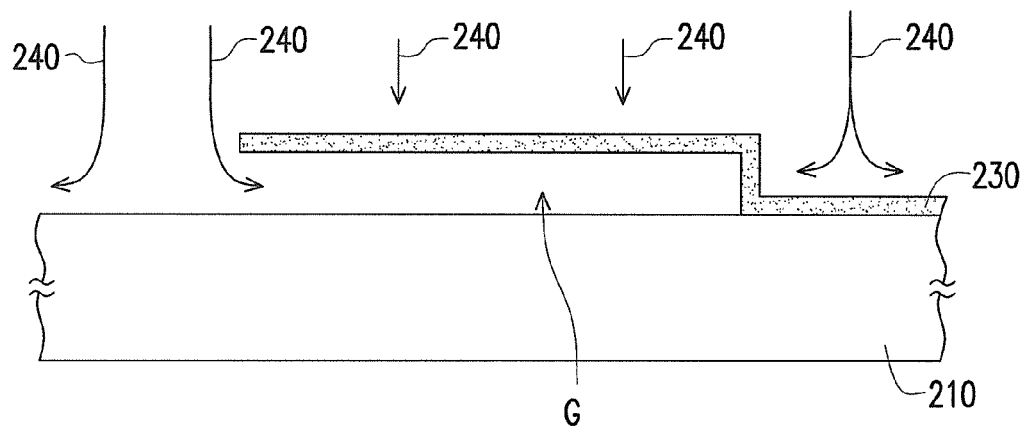

FIGS. 2A to 2C are schematic views showing a process of an air gap fabricating method which can be applied to at least one of exemplary embodiments. Referring to FIG. 2A, a patterned sacrificial layer 220 is first formed on a substrate 210. A material of the pattern sacrificial layer 220 includes a germanium-antimony-tellurium ($Ge_xSb_yTe_z$) alloy, which is a main constituent of the material. A composition ratio X:Y:Z of Ge:Sb:Te may be 2:2:5 or another suitable ratio. The germanium-antimony-tellurium alloy is a special phase change material. A phase change material thin film may be deposited by a physical vapor deposition method, a chemical vapor deposition method, or a suitable thin film deposition method. Next, a general photolithography and etching process is used in cooperation, so that the patterned sacrificial layer 220 in FIG. 2 is obtained.

Referring to FIG. 2B, a dielectric layer 230 is formed on the patterned sacrificial layer 220. A part of the dielectric layer 230 covers the patterned sacrificial layer 220 and the substrate 210 adjacent thereto, and the dielectric layer 230 exposes a part of the patterned sacrificial layer 220. The method of forming the dielectric layer 230 may be using a mask with a thin film deposition process, so that the dielectric layer 230 is partially formed on the patterned sacrificial layer 220. The material of the dielectric layer 230 is, for example, silicon oxide, silicon nitride, or another appropriate dielectric material. If the mechanical strength of the dielectric layer 230 is insufficient so that softening and collapse might occur, the multi-layered stack of a semiconductor layer (not shown) and a metal layer (not shown) may be formed on the dielectric layer 230. A material of the semiconductor layer includes polysilicon or amorphous silicon. A material of the metal layer includes aluminum, copper, tungsten, nickel, cobalt, titanium, a tungsten-titanium alloy, titanium nitride, tantalum nitride, titanium silicide, tantalum silicide, nickel silicide, or cobalt silicide, alone or combination thereof. In detail, amorphous silicon, other metals, semiconductors, or multi-layered dielectric stacks with greater mechanical strength may be formed on or under the dielectric layer 130, or the dielectric layer may be omitted according to the field of application.

Afterwards, referring to FIG. 2C, a reactant 240 is provided to react with the patterned sacrificial layer 220, and the patterned sacrificial layer 220 is removed to form an air gap G disposed at an original position of the patterned sacrificial layer 220.

In one of exemplary embodiments, in the method of fabricating the air gap G, the germanium-antimony-tellurium alloy is used as a main material of the patterned sacrificial layer 220. In particular, the reactant is able to react with the germanium-antimony-tellurium alloy highly selectively, so that it is possible to almost completely remove the patterned sacrificial layer 220. For example, the reactant 240 may include the organic acid which substantially includes, for example, gallic acid and the solvent. The organic acid with gallic acid as a main constituent is able to react well with the germanium-antimony-tellurium alloy, so that the patterned sacrificial layer 230 is almost completely removed by a wet washing method.

Additionally, the reactant may be the hydrogen-helium plasma. Similarly, the hydrogen-helium plasma is able to react well with the germanium-antimony-tellurium alloy, so that the patterned sacrificial layer 220 is almost completely removed by a plasma washing method. Here a composition ratio of the hydrogen-helium plasma and a reaction time of the hydrogen-helium plasma with the patterned sacrificial layer 220 are not limited. For example, according to an embodiment, the weight percentage of hydrogen in the hydrogen-helium plasma is about 5%, and the weight percentage of helium in the hydrogen-helium plasma is about 95%. The hydrogen-helium plasma may react with the patterned sacrificial layer 220 for about 400 to 800 seconds, so as to almost completely remove the patterned sacrificial layer 220.

The above wording of "almost completely remove the patterned sacrificial layer 220" does not mean removing the patterned sacrificial layer 220 with absolutely no residue. By adopting the reactant 240 (the organic acid or the hydrogen-helium plasma) provided according to the present embodiment, a superb space is formed for the structure with the air gap, and almost no or little residue is present. The above may be viewed as the criteria of "almost completely removing" or as the design requirement.

Figure 2D:
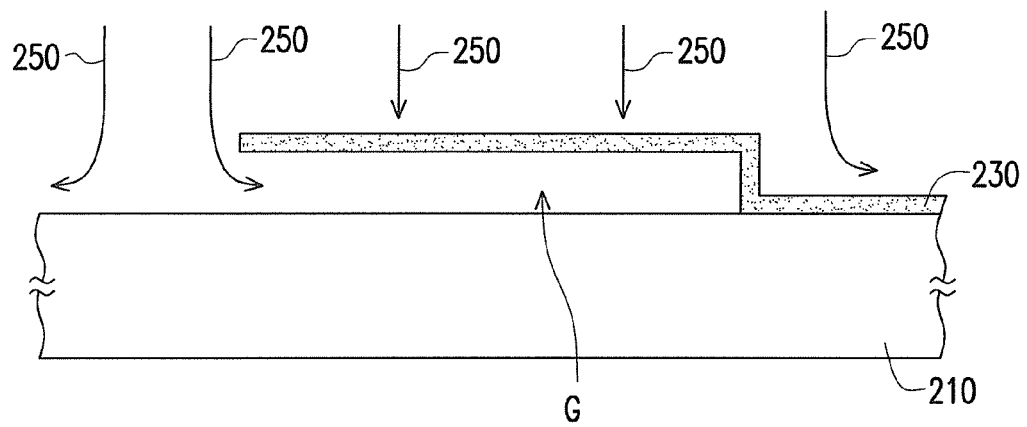

Referring to FIG. 2D, after the step of removing the patterned sacrificial layer 220 as shown in FIG. 2C, the dielectric layer 230 may be washed with deionized water 250. The residual reactant 240 is hence removed.

Figure 2E:
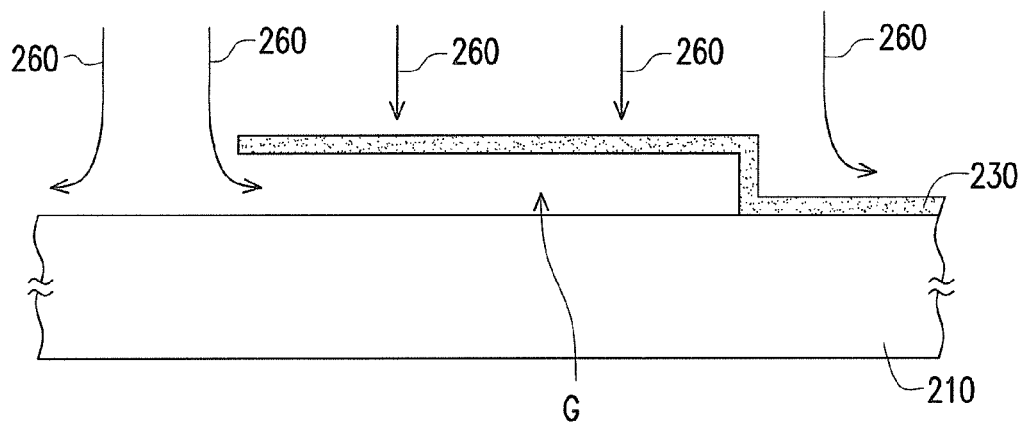

Referring to FIG. 2E, after the step of washing the dielectric layer 230 with the deionized water 250 as shown in FIG. 2D, IPA 260 may be used to dry clean the dielectric layer 230, so as to remove the residual water.

The embodiment in which the germanium-antimony-tellurium alloy reacts with gallic acid (or the hydrogen-helium plasma) to form the air gap G has a great range of applications. For example, it is capable of being used in fields such as micro electro-mechanical systems (MEMS), nano electro-mechanical systems (NEMS), copper wire processes, radio frequency devices, resistive memory deices, and dynamic random access memories.

For example, when the air gap fabricating method is applied in MEMS or NEMS, as shown in FIG. 2A, the patterned sacrificial layer 220 may be fabricated as a pattern which has a high length to width ratio (L/D). As shown in FIG. 2C, when the patterned sacrificial layer 220 is almost completely removed, the dielectric layer 230 becomes a cantilever beam structure. The air gap fabricating method provides a good solution for the obstacles in fabricating miniature cantilever beams in MEMS or NEMS.

In addition, the air gap fabricating method may be used to fabricate the air dielectric layer in the copper wire processes. Compared with a conventional copper wire process in which silicon oxide is used as the dielectric layer, the copper wire processes which adopts the air dielectric layer has smaller parasitic capacitance. In addition, the air gap fabricating method may also be used to fabricate the air dielectric layer in the radio frequency devices. Compared with a conventional radio frequency device in which silicon oxide is used as the dielectric layer, the air dielectric layers which has the air dielectric layer has a faster operating speed.

Figure 3A:
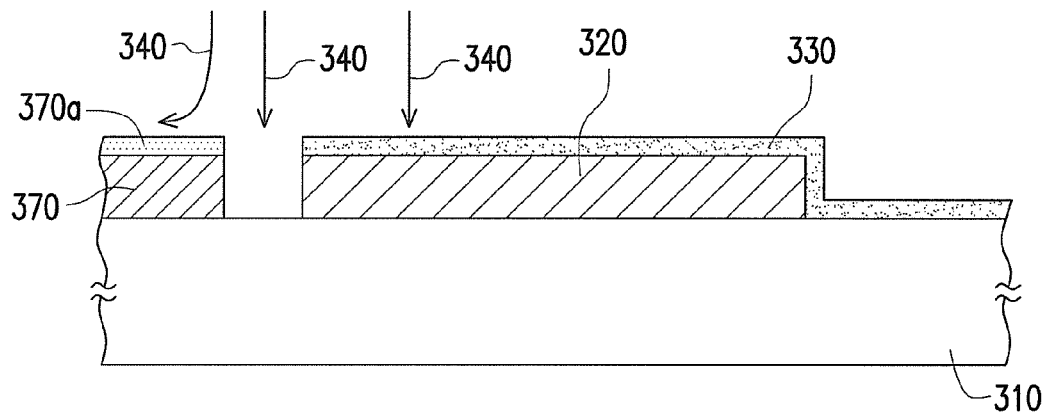
FIGS. 3A to 3B are schematic views showing a partial process of another air gap fabricating method according to an embodiment of the invention.
Figure 3B:
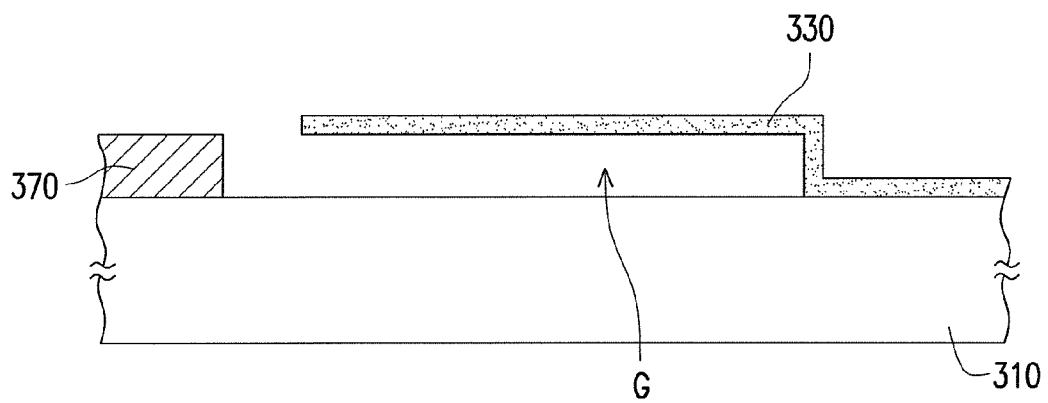

FIGS. 3A to 3B are schematic views showing a partial process of another air gap fabricating method which can be applied to at least one of exemplary embodiments. Referring to both FIGS. 3A and 3B, a metal pattern 370 is formed on the substrate 310, and a metal oxide layer 370a is formed on the metal pattern 370. When the reactant is used to remove the patterned sacrificial layer 320, the reactant also removes the metal oxide layer 370a.

The reactant (such as the hydrogen-helium plasma) is capable of removing the native oxide by reduction (which is the metal oxide layer 370a, the reduced metal is still stayed at its original metal oxide position) of the metal pattern 370. Furthermore, it can be known from the above description that the reactant has high reactivity towards the germanium-antimony-tellurium alloy. By utilizing such a characteristic, as in the embodiment shown in FIGS. 3A and 3B, the reactant (gallic acid or the hydrogen-helium plasma) is capable of simultaneously removing the metal oxide layer 370a and the patterned sacrificial layer 320, but does not affect the dielectric layer 330a and the metal pattern 370.

The annealing temperature of the patterned sacrificial layer 320 shown in FIGS. 3A and 3A is from about 100° C. to 400° C. (the main constituent that is used is the germanium-antimony-tellurium alloy). The deposition temperature of the patterned sacrificial layer 320 during the step of chemical vapor depositing the metal film (generally at a temperature of about 300° C. to 400° C.), the patterned sacrificial layer 320 is used in cooperation with the reactant to fabricate the air gap G, and the flexibility of the process is thereby enhanced. Generally, by using a method in which the photoresist is used as the patterned sacrificial layer and along with a photoresist stripper or an oxygen plasma to fabricate the air gap G, the patterned sacrificial layer which has the photoresist as a constituent cannot sustain the high temperature of about 200° C. to 400° C.

The air gap fabricating method has a great range of applications. The following provides relevant disclosure on the resistive memory device, but the invention is not limited thereto.

In the air gap fabricating method, the patterned sacrificial layer which has a main constituent of the germanium-antimony-tellurium alloy is used in cooperation with the reactant (which is mainly gallic acid or the hydrogen-helium plasma) which is highly reactive towards the patterned sacrificial layer, so that the patterned sacrificial layer is almost completely removed and the air gap is fabricated. By using the resistive memory device and the fabricating method thereof which applies the air gap fabricating method, the resistive memory device with the air gap is fabricated. During the process of fabricating the resistive memory device, the patterned sacrificial layer having a main constituent of the germanium-antimony-tellurium alloy further has the effects of protecting the resistance switching material layer.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A resistive memory device, comprising:
a substrate, having an active region, wherein a front end circuit is formed in the active region, and the front end circuit has a plurality of conductive channels arranged as an array;
a plurality of bottom electrodes which are disposed in the active region, each of the bottom electrodes being disposed to correspond to each of the conductive channels;
a patterned resistance switching material layer and a patterned top electrode layer which are sequentially stacked on the plurality of bottom electrodes, wherein a continuous air dielectric layer exists between the patterned resistance switching material layer and the plurality of bottom electrodes, wherein the patterned resistance switching material layer is a continuous layer; and
a plurality of patterned interconnections, which are disposed on the patterned top electrode.

2. The resistive memory device of claim 1, wherein each of the bottom electrodes comprises a first film layer and a second film layer on the first film layer; a material of the first film layer and the second film layer comprising a titanium (Ti) and titanium nitride (TiN).

3. The resistive memory device of claim 1, wherein a material of the resistance switching material layer comprises hafnium oxide ($HfO_x$), nickel oxide ($NiO_x$), titanium oxide ($TiO_x$), zirconium oxide ($ZrO_x$), silicon oxide ($SiO_x$), tungsten oxide ($WO_x$), or copper oxide ($CuO_x$).

4. The resistive memory device of claim 1, wherein the top electrode comprises a third film layer and a fourth film layer on the third film layer; a material of the third film layer and the fourth film layer comprising a titanium (Ti) and titanium nitride (TiN).

5. The resistive memory device of claim 1, wherein a material of the plurality of patterned interconnections comprises an aluminum-copper (Al—Cu) alloy, an aluminum-tantalum nitride (Al—TaN) bi-layer, an aluminum-copper-tantalum nitride (AlCu—TaN) bi-layer, an aluminum-copper-titanium nitride (AlCu—TiN) bi-layer or another material which comprises an aluminum-metal single or multi-layer.

6. The resistive memory array of claim 1, wherein the air dielectric layer further exists in the outer edge of the patterned resistance switching material layer.

7. A resistive memory device with an memory array, wherein the memory array comprising:
    an active region, formed in a substrate;
    a conductive channel, formed in the active region;
    a plurality of bottom electrodes being disposed on the active region, wherein the plurality of bottom electrodes is disposed on and connected to the conductive channel;
    a patterned resistance switching material layer and a patterned top electrode layer which are sequentially stacked on the plurality of bottom electrodes, wherein a continuous air dielectric layer exists extending between the patterned resistance switching material layer and the plurality of bottom electrodes, wherein the patterned resistance switching material layer is a continuous layer; and
    an interconnection, being disposed on the patterned top electrode.

* * * * *